(12) United States Patent
Ramsay et al.

(10) Patent No.: US 11,270,480 B2
(45) Date of Patent: Mar. 8, 2022

(54) METHOD FOR N-DIMENSIONAL DETECTION OF SPATIAL, TEMPORAL AND GRAVIMETRIC ATTRIBUTES AND ASSOCIATED VARIATION IN PLOTS, DIGITAL OBJECTS AND PHOTOGRAPHS

(71) Applicant: Halliburton Energy Services, Inc., Houston, TX (US)

(72) Inventors: Travis St. George Ramsay, Hockley, TX (US); Brian Dale Davis, Houston, TX (US)

(73) Assignee: Landmark Graphics Corporation, Houston, TX (US)

( * ) Notice: Subject to any disclaimer, the term of this patent is extended or adjusted under 35 U.S.C. 154(b) by 185 days.

(21) Appl. No.: 15/749,613

(22) PCT Filed: Sep. 10, 2015

(86) PCT No.: PCT/US2015/049503
§ 371 (c)(1),
(2) Date: Feb. 1, 2018

(87) PCT Pub. No.: WO2017/044108
PCT Pub. Date: Mar. 16, 2017

(65) Prior Publication Data
US 2018/0225850 A1    Aug. 9, 2018

(51) Int. Cl.
*G01V 99/00* (2009.01)
*G06T 11/20* (2006.01)
(Continued)

(52) U.S. Cl.
CPC .......... *G06T 11/206* (2013.01); *G01V 99/005* (2013.01); *G06F 3/04815* (2013.01); *G06F 30/00* (2020.01); *G01V 7/00* (2013.01)

(58) Field of Classification Search
CPC ... G06T 11/20; G06T 11/206; G06T 2210/36; G06T 2200/24; G01V 99/005; G01V 7/00; G06F 3/04815; G06F 17/50
See application file for complete search history.

(56) References Cited

U.S. PATENT DOCUMENTS

| 2007/0255545 A1* | 11/2007 | Pita ......................... G01V 11/00 703/10 |
| 2008/0294387 A1* | 11/2008 | Anderson .............. G01V 11/00 703/1 |

(Continued)

FOREIGN PATENT DOCUMENTS

WO    WO 2006/104764 A2    10/2006

OTHER PUBLICATIONS

International Search Report and The Written Opinion of the International Search Authority, or the Declaration, dated Jun. 29, 2016, PCT/US2015/049503, 11 pages, ISA/KR.

*Primary Examiner* — Rinna Yi
(74) *Attorney, Agent, or Firm* — Haynes and Boone, LLP

(57) ABSTRACT

Methods and systems are presented in this disclosure for high-dimensional detection and visualization. Detection in a higher-dimensional domain of at least one of an event or one or more objects within a visualization environment can be performed by identifying at least one evolution of the event or a dynamic property of the one or more objects. The at least one evolution of the event or the one or more objects having the dynamic property can be displayed within the visualization environment. Appropriate operations can be initiated based on the at least one evolution of the event or the one or more objects.

13 Claims, 5 Drawing Sheets

(51) Int. Cl.
    *G06F 30/00*     (2020.01)
    *G06F 3/04815*     (2022.01)
    *G01V 7/00*     (2006.01)

(56) References Cited

U.S. PATENT DOCUMENTS

| | | | |
|---|---|---|---|
| 2009/0067725 | A1 | 3/2009 | Sasakawa et al. |
| 2009/0115779 | A1 | 5/2009 | Shulman et al. |
| 2009/0125367 | A1* | 5/2009 | Brink ............... G06Q 10/06 705/7.41 |
| 2009/0278938 | A1 | 11/2009 | Shulman |
| 2009/0319243 | A1* | 12/2009 | Suarez-Rivera ....... G06T 17/05 703/10 |
| 2010/0100835 | A1 | 4/2010 | Klaric et al. |
| 2011/0320182 | A1* | 12/2011 | Dommisse ............. G01V 1/34 703/10 |
| 2012/0188091 | A1* | 7/2012 | Calleja ................. G01V 3/38 340/854.1 |
| 2012/0274664 | A1* | 11/2012 | Fagnou ................ E21B 41/00 345/660 |
| 2013/0116998 | A1* | 5/2013 | Shirzadi ............... E21B 43/20 703/10 |
| 2013/0346035 | A1* | 12/2013 | Madasu ............... E21B 43/00 703/2 |
| 2014/0118334 | A1* | 5/2014 | Guijt .................. G06T 11/206 345/419 |
| 2016/0230514 | A1* | 8/2016 | Urdaneta ............. E21B 41/00 |

* cited by examiner

METHOD FOR N-DIMENSIONAL DETECTION OF SPATIAL, TEMPORAL AND GRAVIMETRIC ATTRIBUTES AND ASSOCIATED VARIATION IN PLOTS, DIGITAL OBJECTS AND PHOTOGRAPHS

PRIORITY

The present application is a U.S. National Stage patent application of International Patent Application No. PCT/US2015/049503, filed on Sep. 10, 2015, the benefit of which is claimed and the disclosure of which is incorporated herein by reference in its entirety.

TECHNICAL FIELD

The present disclosure generally relates to event and object detection and, more particularly, to a high-dimensional detection of spatial, temporal and gravimetric attributes and associated variation in plots, digital objects and photographs.

BACKGROUND

Users of any visualization software application often display a tremendous amount of one-dimensional (1D), two-dimensional (2D) and three-dimensional (3D) data with time variance. This usually implies simultaneous display of multiple data objects within a single visualization environment where certain objects have attributes that may vary spatially, temporally and/or gravimetrically. The ability to identify temporal, gravimetrical as well as multiple objects is typically difficult and time consuming. Methods of event identification are often esoteric, time consuming and involve detailed user knowledge of data attribute characteristics. Exclusive visual inspection of multiple instances of data at different time intervals is typically subjective, prohibitive (as no user can truly observe every data property instance at one moment with manipulating the object being analyzed), and remains a futile exercise accumulating non-productive time of software application users.

BRIEF DESCRIPTION OF THE DRAWINGS

Various embodiments of the present disclosure will be understood more fully from the detailed description given below and from the accompanying drawings of various embodiments of the disclosure. In the drawings, like reference numbers may indicate identical or functionally similar elements.

DETAILED DESCRIPTION

Figure 1:
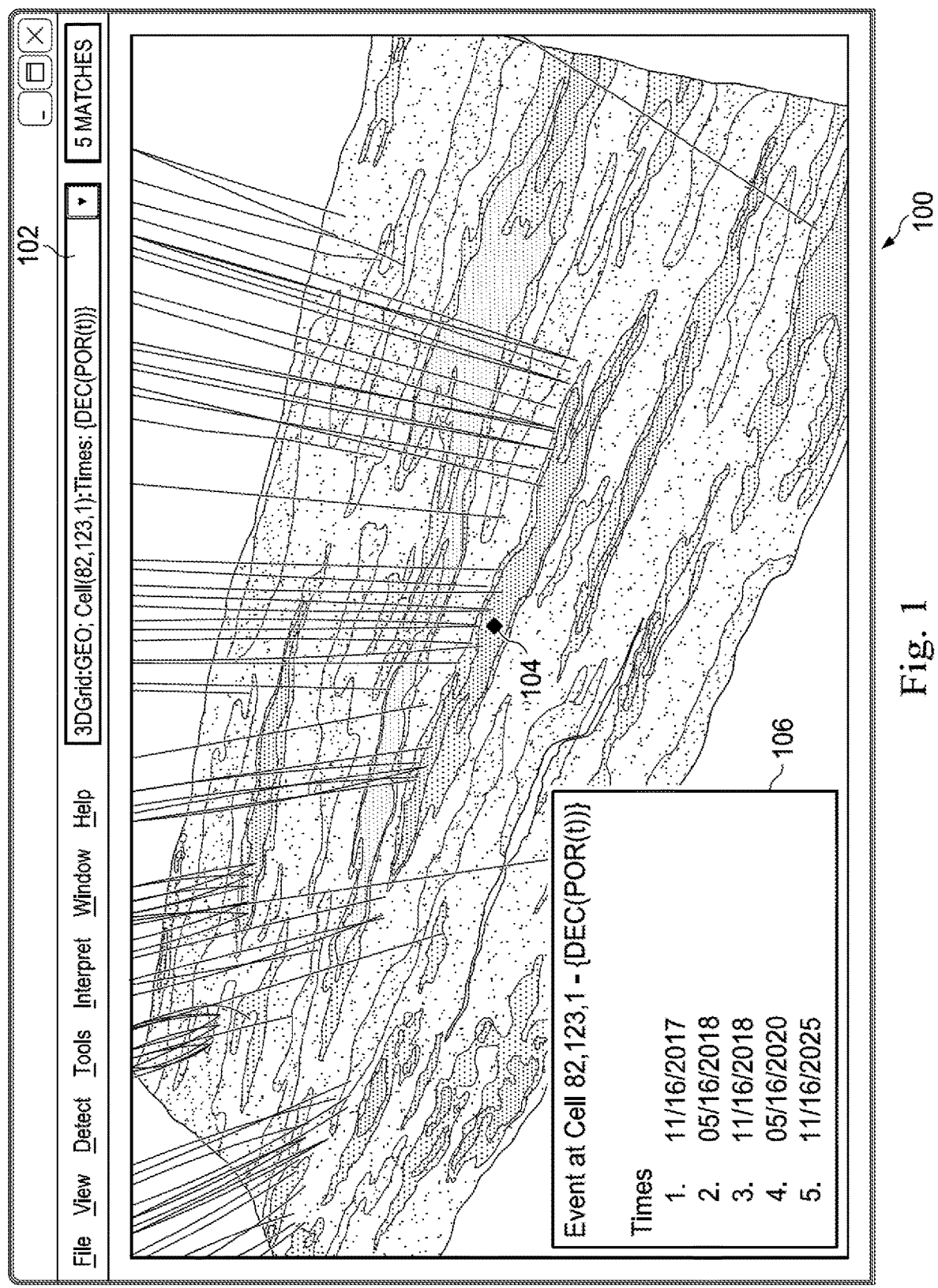
FIG. 1 is an example view of a graphical user interface containing three-dimensional (3D) grid, an array of porosity data, well data and illustrating the detection of a reduction in porosity for cells in the array of porosity data, according to certain embodiments of the present disclosure.

Embodiments of the present disclosure relate to methods and apparatus for high-dimensional detection of spatial, temporal and gravimetrical attributes and associated variation in plots, digital objects and/or photographs. While the present disclosure is described herein with reference to illustrative embodiments for particular applications, it should be understood that embodiments are not limited thereto. Other embodiments are possible, and modifications can be made to the embodiments within the spirit and scope of the teachings herein and additional fields in which the embodiments would be of significant utility.

In the detailed description herein, references to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to implement such feature, structure, or characteristic in connection with other embodiments whether or not explicitly described. It would also be apparent to one skilled in the relevant art that the embodiments, as described herein, can be implemented in many different embodiments of software, hardware, firmware, and/or the entities illustrated in the figures. Any actual software code with the specialized control of hardware to implement embodiments is not limiting of the detailed description. Thus, the operational behavior of embodiments will be described with the understanding that modifications and variations of the embodiments are possible, given the level of detail presented herein.

The disclosure may repeat reference numerals and/or letters in the various examples or Figures. This repetition is for the purpose of simplicity and clarity and does not in itself dictate a relationship between the various embodiments and/or configurations discussed. Further, spatially relative terms, such as beneath, below, lower, above, upper, uphole, downhole, upstream, downstream, and the like, may be used herein for ease of description to describe one element or feature's relationship to another element(s) or feature(s) as illustrated, the upward direction being toward the top of the corresponding figure and the downward direction being toward the bottom of the corresponding figure, the uphole direction being toward the surface of the wellbore, the downhole direction being toward the toe of the wellbore. Unless otherwise stated, the spatially relative terms are intended to encompass different orientations of the apparatus in use or operation in addition to the orientation depicted in the Figures. For example, if an apparatus in the Figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Moreover even though a Figure may depict a horizontal wellbore or a vertical wellbore, unless indicated otherwise, it should be understood by those skilled in the art that the apparatus according to the present disclosure is equally well suited for use in wellbores having other orientations including vertical wellbores, slanted wellbores, multilateral wellbores or the like. Likewise, unless otherwise noted, even though a Figure may depict an offshore operation, it should be understood by those skilled in the art that the apparatus according to the present disclosure is equally well suited for use in onshore operations and vice-versa. Further, unless otherwise noted, even though a Figure may depict a cased hole, it should be understood by those skilled in the art that the apparatus according to the present disclosure is equally well suited for use in open hole operations.

Illustrative embodiments and related methods of the present disclosure are described below in reference to FIGS. 1-6 as they might be employed for high-dimensional detection of spatial, temporal and gravimetrical attributes and associated variation in plots, digital objects and/or photographs. Such embodiments and related methods may be practiced, for example, using a computer system as described herein. Other features and advantages of the disclosed embodiments will be or will become apparent to one of ordinary skill in the art upon examination of the following figures and detailed description. It is intended that all such additional features and advantages be included within the scope of the disclosed embodiments. Further, the illustrated figures are only exemplary and are not intended to assert or imply any limitation with regard to the environment, architecture, design, or process in which different embodiments may be implemented.

Embodiments of the present disclosure relate to an N-dimensional (e.g., N>3) based detection of an event and/or object directly in a visualization environment regardless of the specific time, space and/or gravimetrical state being displayed. The detection presented herein may be applied to identify a particular state or evolution of an event or localized variability, i.e., time, space and/or gravity dependent (dynamic) property existence, of an object and/or an event. Certain embodiments of the present disclosure relate to performing detection of a specific change in a property with time and/or space, e.g., $dSw(t,x)/dt$ and/or $dSw(t,x)/dx$, where Sw represents a water saturation, x is the spatial component in 1, 2 or 3 coordinate axes, and t is the temporal component. Furthermore, object and event detection may be restricted by any user-defined criteria (e.g., intersecting property like wells, layers, perforations, spatial location, time and length scales) and data attributes, such as type or other metadata associated with objects being detected.

Embodiments of the present disclosure further relate to additional feature-oriented capabilities that comprise chart-driven "drag and drop" based display, which may allow a user to select an event in a two-dimensional (2D) time dependent or independent chart, and have the corresponding array, at which the event occurs, displayed in 2D or three-dimensional (3D) visualization environment based on dragging the chart event to the visualization space. In one or more other embodiments, the array may be displayed in the visualization space by a right-click menu item. In the case of time dependent data, a frequency at which array data is generated may differ from that of the plotted chart data. As a result, a visual indicator may be utilized in the chart to notify the user of available time dependent events that can be displayed in a corresponding 2D or 3D visualization environment.

In one or more embodiments, based on the detection criteria (e.g., grid, property, event, well and/or location of interest) provided by the user, the underlying algorithm may identify specific or all available data object properties possessing a particular higher-order dimension dependent data attribute (e.g., higher-order dimension greater than three for three dimensions of space, gravity and/or multiple instances of time). In response, the algorithm may return a report of the identified occurrence(s) of the particular event/attribute even though the instance of the object properties queried may exist in an alternate/non-displayed dimension (e.g., greater than three).

FIG. 1 illustrates a graphical user interface 100 containing 3D grid, an array of porosity data, and well data, showing the detection of a reduction in porosity for cells in the array of porosity data, according to certain embodiments of the present disclosure. Syntax in command line 102 illustrated in FIG. 1 triggers event detection performed in a 3D porosity array at a specified cell location 104 (e.g., cell location (82, 123, 1) specified in command line 102) that features a decrease in porosity over time, which is a specific property defined by the illustrated syntax in command line 102. As illustrated in FIG. 1, the user can then visualize the data attribute at the time of the event and perform further analysis. As illustrated by visualization block 106 in FIG. 1, the graphical user interface (visualization environment) 100 provides time instances for the specified cell location 104 when the decrease in porosity occurs, i.e., when the specific defined property is satisfied.

In one or more embodiments, an additional enhancement of the visualization environment 100 in FIG. 1 would be, for example, to plot the variation of the user-desired property (e.g., decrease in porosity with time) directly from the 3D visualization environment. In one or more other embodiments, instead of the decrease in porosity utilized in the visualization environment 100, some other function that defines a change of a particular property (e.g., petrophysical property, rock physics property, chemical property, thermal property, hydrological property, mechanical property, fluid saturation, and the like) or a group of properties (e.g., any combination of petrophysical property, rock physics property, chemical property, thermal property, hydrological property, mechanical property, porosity, and saturation) over at least one of time, space, gravity, or some other dimension(s) can be specified. The concept presented herein, while disclosed for the display of N-dimensional data sets (e.g., N>3 when each data set features three dimensions of space, gravity and/or multiple instances of time), can be extended to photographs and aerial photogrammetry in order to detect changes in attribute pixel intensity over selected spectral wavelengths and/or locations, as discussed in more detail below.

Figure 2:
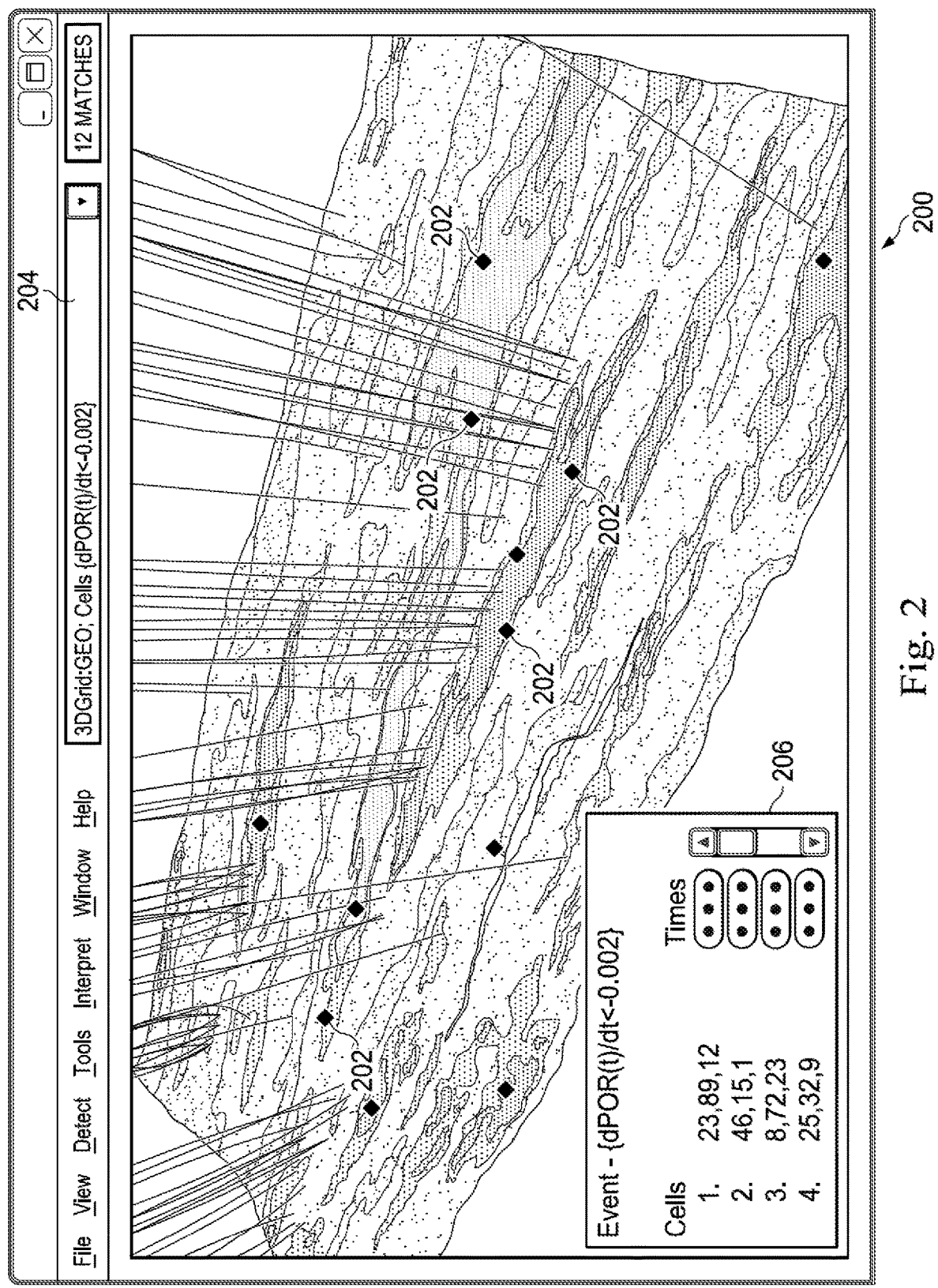
FIG. 2 is an example view of a graphical user interface illustrating rate detection for cells in an array of porosity data that experience a decrease in porosity over time for a predetermined rate, according to certain embodiments of the present disclosure.

Embodiments of the present disclosure may further support performing attribute related rate detection between time-dependent calculations of a given data attribute. In this scenario, a user would indicate an event/object query based on the change of the data attribute (e.g., the attribute $\Omega$) with time (t), such that the detection criteria are governed by the rate of change, $d\Omega/dt$. FIG. 2 shows a graphical user interface 200 illustrating the rate detection for cells in an array of porosity data that experience a decrease in porosity over time, according to certain embodiments of the present disclosure. The graphical user interface (visualization environment) 200 in FIG. 2 visualizes cell locations 202 that feature the decrease in porosity over time being less than 0.002, i.e., dPOR(t)/dt<−0.002, as specified by syntax in command line 204.

As illustrated in FIG. 2, the underlying algorithm would assess the desired change in property over the related change in time given disparate instances of the data attribute in the temporal domain. The user can then visualize the data attribute at the identified time and perform further analysis. For example, an additional enhancement would be to plot the variation of the user-desired property with time. As illustrated by visualization block 206 in FIG. 2, the graphical user interface 200 lists (and visualizes) all cell locations that feature the decrease in porosity over time being less than 0.002 and lists time instances for each cell location when the specified function is satisfied (e.g., when dPOR(t)/dt<−0.002). In one or more embodiments, instead of the function that defines the decrease in porosity over time, some other function can be specified in relation to the visualization environment 200 in FIG. 2, e.g., a function that defines a rate of change of a single or multiple properties (e.g., combination of properties such as porosity, saturation, and the like) over at least one of time, space, gravity, or some other dimension(s).

Figure 3A:
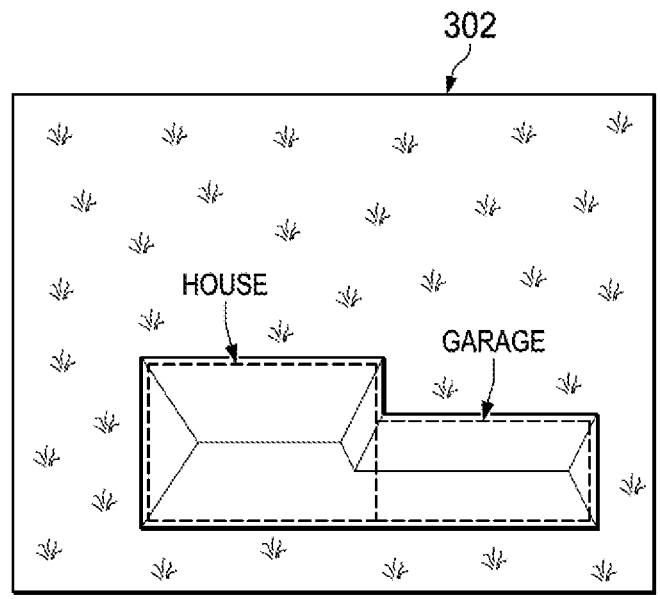
FIG. 3 is an example view of aerial photographs comprising objects with attributes that vary spatially and temporally, according to certain embodiments of the present disclosure.
Figure 3B:
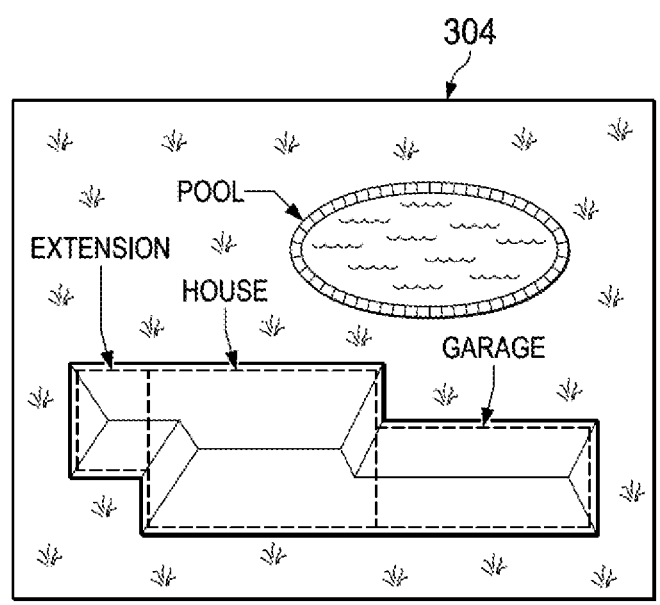

In one or more embodiments, as discussed above, the concept presented herein can be extended to a series of photographs (e.g., photographic morphing) and areal photogrammetry in order to evaluate the rate of change of attribute pixel intensity over selected spectral wavelengths and locations. FIG. 3 illustrates aerial photographs 302 and 304 comprising objects with attributes that vary spatially and/or temporally, according to certain embodiments of the present disclosure. The aerial photograph 302 illustrates an original aerial photograph of a property containing a house and a garage, at time t=0 year. The aerial photograph 304 illustrates depiction of the same property at some later time (e.g., at time t=2 years), where an extension to the house and a pool have been added to the property. FIG. 3 may illustrate the use of technology presented in this disclosure for, for example, municipal property tax assessment based on time-lapsed photogrammetry. For certain embodiments, the implementation of the technique presented herein would indicate the presence of an extension to the house and a leisure pool in the backyard (e.g., as illustrated by the aerial photograph 304 in FIG. 3) based on changes in wavelength spectra over time.

Figure 4:
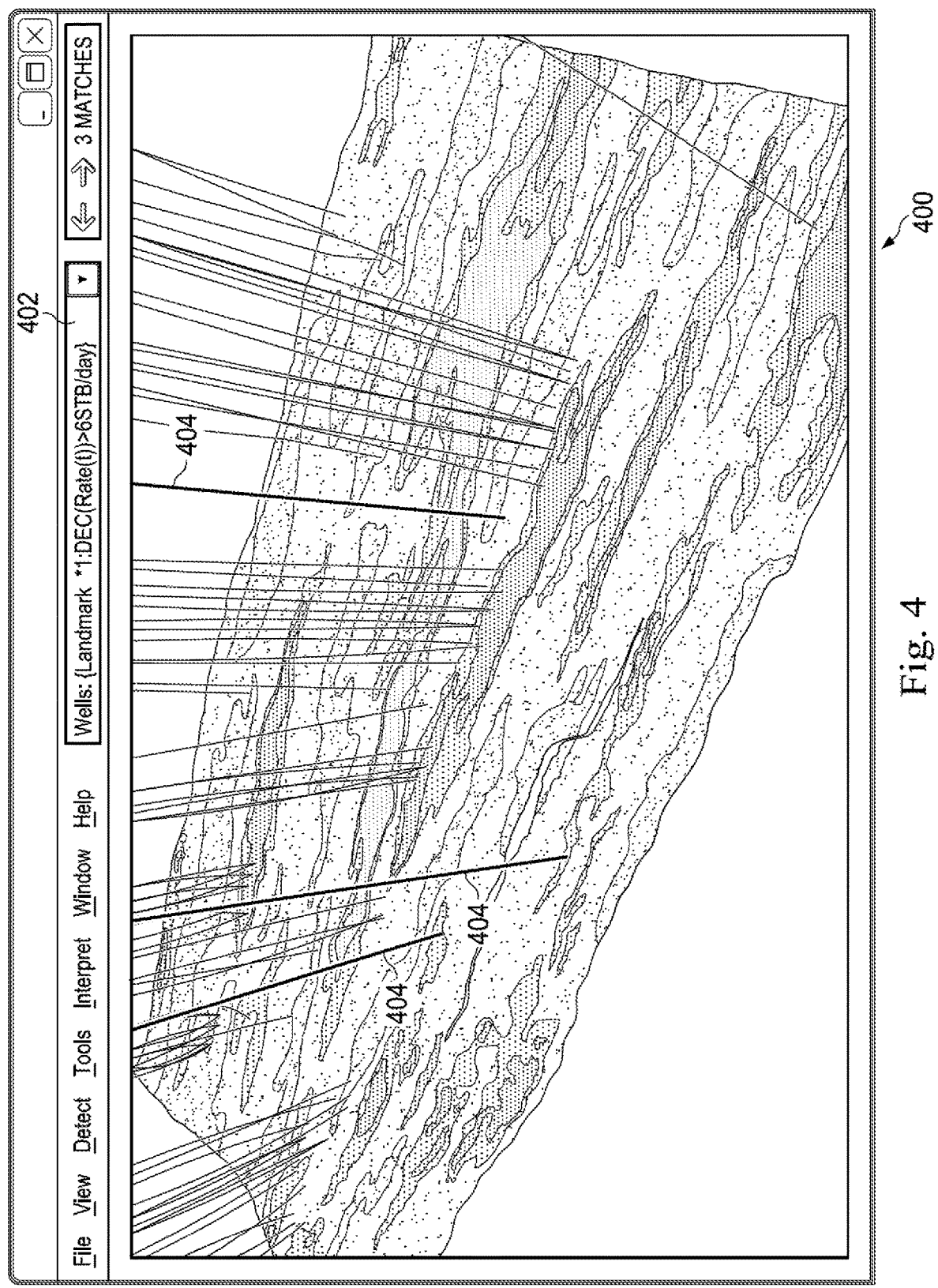
FIG. 4 is an example view of visualization environment illustrating hydrocarbon wells having production rates that vary temporally in a specific manner, according to certain embodiments of the present disclosure.

Embodiments of the present disclosure can be further used to facilitate spatial object detection in the visualization environment. For example, in the absence of temporal or gravimetric data, the static object detection mechanism may allow for object identification in the visualization environment presented herein. FIG. 4 illustrates a graphical user interface (visualization environment) 400 showing particular hydrocarbon wells having production rates that vary temporally in a specified manner, according to certain embodiments of the present disclosure. As illustrated in FIG. 4, a user may enter a well name using a wildcard (e.g., "*", as indicated by syntax in command line 402) and a production decline rate criteria (e.g., production rate decline exceeding the amount of 6 stock tank barrels (STB) per day, as also indicated by syntax in command line 402). As a result, the visualization environment 400 may highlight corresponding hydrocarbon wells (e.g., wells 404, as illustrated in FIG. 4) that satisfy the specific user-defined criteria (e.g., the prediction decline rate being equal to a certain amount). In one or more other embodiments, static objects may be identified in the presented visualization environment based on other user-defined property or a group of properties associated with the objects.

Figure 5:
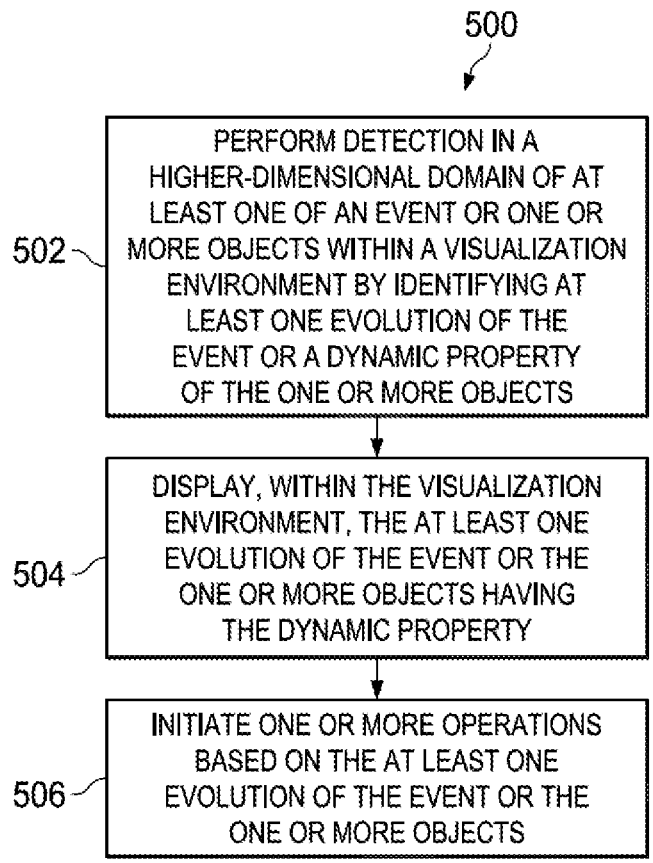
FIG. 5 is a flow chart of a method for high-dimensional detection of spatial, temporal and gravimetric attributes and associated variation in objects and/or events, according to certain embodiments of the present disclosure.

Discussion of an illustrative method of the present disclosure will now be made with reference to FIG. 5, which is a flow chart 500 of a method for high-dimensional detection of spatial, temporal and gravimetric attributes and associated variation in objects and/or events, according to certain embodiments of the present disclosure. The method begins at 502 by performing detection in a higher-dimensional domain of at least one of an event or one or more objects within a visualization environment (e.g., the graphical user interface illustrated in FIGS. 1, 2 and 4) by identifying at least one evolution of the event or a dynamic property of the one or more objects. At 504, the at least one evolution of the event or the one or more objects having the dynamic property may be displayed within the visualization environment. At 506, one or more operations may be initiated based on the at least one evolution of the event or the one or more objects.

Figure 6:
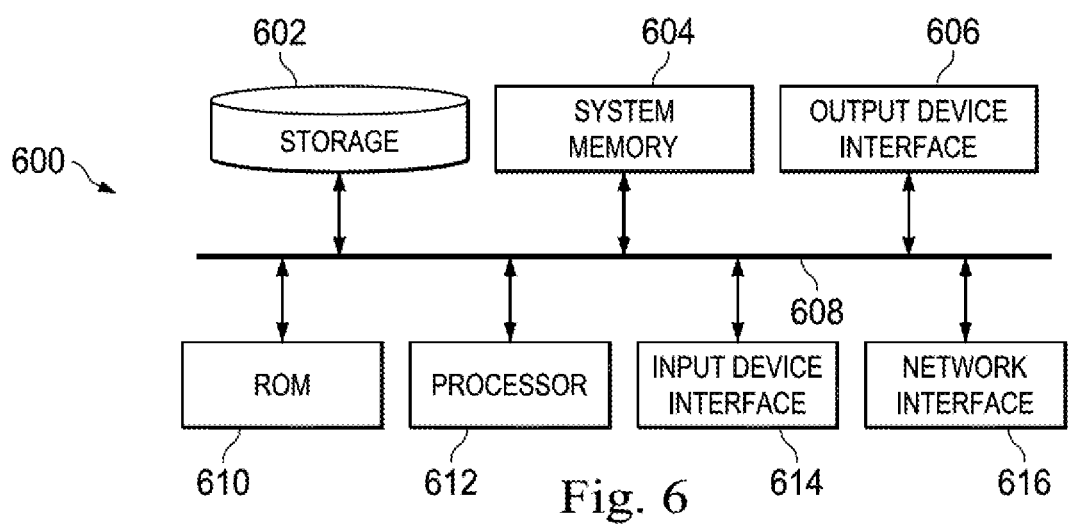
FIG. 6 is a block diagram of an illustrative computer system in which embodiments of the present disclosure may be implemented.

FIG. 6 is a block diagram of an illustrative computing system 600 in which embodiments of the present disclosure may be implemented adapted for high-dimensional detection of spatial, temporal and/or gravimetric attributes and associated variation in objects and/or events. For example, the operations of method 500 of FIG. 5, as described above, may be implemented using the computing system 600. The computing system 600 can be a computer, phone, personal digital assistant (PDA), or any other type of electronic device. Such an electronic device includes various types of computer readable media and interfaces for various other types of computer readable media. As shown in FIG. 6, the computing system 600 includes a permanent storage device 602, a system memory 604, an output device interface 606, a system communications bus 608, a read-only memory (ROM) 610, processing unit(s) 612, an input device interface 614, and a network interface 616.

The bus 608 collectively represents all system, peripheral, and chipset buses that communicatively connect the numerous internal devices of the computing system 600. For instance, the bus 608 communicatively connects the processing unit(s) 612 with the ROM 610, the system memory 604, and the permanent storage device 602.

From these various memory units, the processing unit(s) 612 retrieves instructions to execute and data to process in order to execute the processes of the subject disclosure. The processing unit(s) can be a single processor or a multi-core processor in different implementations.

The ROM 610 stores static data and instructions that are needed by the processing unit(s) 612 and other modules of the computing system 600. The permanent storage device 602, on the other hand, is a read-and-write memory device. This device is a non-volatile memory unit that stores instructions and data even when the computing system 600 is off. Some implementations of the subject disclosure use a mass-storage device (such as a magnetic or optical disk and its corresponding disk drive) as the permanent storage device 602.

Other implementations use a removable storage device (such as a floppy disk, flash drive, and its corresponding disk drive) as the permanent storage device 602. Like the permanent storage device 602, the system memory 604 is a read-and-write memory device. However, unlike the storage device 602, the system memory 604 is a volatile read-and-write memory, such a random access memory. The system memory 604 stores some of the instructions and data that the processor needs at runtime. In some implementations, the processes of the subject disclosure are stored in the system memory 604, the permanent storage device 602, and/or the ROM 610. For example, the various memory units include instructions for computer aided pipe string design based on existing string designs in accordance with some implementations. From these various memory units, the processing unit(s) 612 retrieves instructions to execute and data to process in order to execute the processes of some implementations.

The bus 608 also connects to the input and output device interfaces 614 and 606. The input device interface 614 enables the user to communicate information and select commands to the computing system 600. Input devices used with the input device interface 614 include, for example, alphanumeric, QWERTY, or T9 keyboards, microphones, and pointing devices (also called "cursor control devices"). The output device interfaces 606 enables, for example, the display of images generated by the computing system 600. Output devices used with the output device interface 606 include, for example, printers and display devices, such as cathode ray tubes (CRT) or liquid crystal displays (LCD). Some implementations include devices such as a touchscreen that functions as both input and output devices. It should be appreciated that embodiments of the present disclosure may be implemented using a computer including any of various types of input and output devices for enabling interaction with a user. Such interaction may include feedback to or from the user in different forms of sensory feedback including, but not limited to, visual feedback, auditory feedback, or tactile feedback. Further, input from the user can be received in any form including, but not limited to, acoustic, speech, or tactile input. Additionally, interaction with the user may include transmitting and receiving different types of information, e.g., in the form of documents, to and from the user via the above-described interfaces.

Also, as shown in FIG. 6, the bus 608 also couples the computing system 600 to a public or private network (not shown) or combination of networks through a network interface 616. Such a network may include, for example, a local area network ("LAN"), such as an Intranet, or a wide area network ("WAN"), such as the Internet. Any or all components of the computing system 600 can be used in conjunction with the subject disclosure.

These functions described above can be implemented in digital electronic circuitry, in computer software, firmware or hardware. The techniques can be implemented using one or more computer program products. Programmable processors and computers can be included in or packaged as mobile devices. The processes and logic flows can be performed by one or more programmable processors and by one or more programmable logic circuitry. General and special purpose computing devices and storage devices can be interconnected through communication networks.

Some implementations include electronic components, such as microprocessors, storage and memory that store computer program instructions in a machine-readable or computer-readable medium (alternatively referred to as computer-readable storage media, machine-readable media, or machine-readable storage media). Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, read-only and recordable Blu-Ray® discs, ultra density optical discs, any other optical or magnetic media, and floppy disks. The computer-readable media can store a computer program that is executable by at least one processing unit and includes sets of instructions for performing various operations. Examples of computer programs or computer code include machine code, such as is produced by a compiler, and files including higher-level code that are executed by a computer, an electronic component, or a microprocessor using an interpreter.

While the above discussion primarily refers to microprocessor or multi-core processors that execute software, some implementations are performed by one or more integrated circuits, such as application specific integrated circuits (ASICs) or field programmable gate arrays (FPGAs). In some implementations, such integrated circuits execute instructions that are stored on the circuit itself. Accordingly, the operations of method 500 of FIG. 5, as described above, may be implemented using the computing system 600 or any computer system having processing circuitry or a computer program product including instructions stored therein, which, when executed by at least one processor, causes the processor to perform functions relating to these methods.

As used in this specification and any claims of this application, the terms "computer", "server", "processor", and "memory" all refer to electronic or other technological devices. These terms exclude people or groups of people. As used herein, the terms "computer readable medium" and "computer readable media" refer generally to tangible, physical, and non-transitory electronic storage mediums that store information in a form that is readable by a computer.

Embodiments of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), an internetwork (e.g., the Internet), and peer-to-peer networks (e.g., ad hoc peer-to-peer networks).

The computing system can include clients and servers. A client and server are generally remote from each other and typically interact through a communication network. The relationship of client and server arises by virtue of computer programs implemented on the respective computers and having a client-server relationship to each other. In some embodiments, a server transmits data (e.g., a web page) to a client device (e.g., for purposes of displaying data to and receiving user input from a user interacting with the client device). Data generated at the client device (e.g., a result of the user interaction) can be received from the client device at the server.

It is understood that any specific order or hierarchy of operations in the processes disclosed is an illustration of exemplary approaches. Based upon design preferences, it is understood that the specific order or hierarchy of operations in the processes may be rearranged, or that all illustrated operations be performed. Some of the operations may be performed simultaneously. For example, in certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Furthermore, the illustrative methods described herein may be implemented by a system including processing circuitry or a computer program product including instructions which, when executed by at least one processor, causes the processor to perform any of the methods described herein.

A computer-implemented method for high-dimensional detection has been described in the present disclosure and may generally include: performing detection in a higher-dimensional domain of at least one of an event or one or more objects within a visualization environment by identifying at least one evolution of the event or a dynamic property of the one or more objects; displaying, within the visualization environment, the at least one evolution of the event or the one or more objects having the dynamic property; and initiating one or more operations based on the at least one evolution of the event or the one or more objects. Further, a computer-readable storage medium with instructions stored therein has been described, instructions when executed by a computer cause the computer to perform a plurality of functions, including functions to: perform detection in a higher-dimensional domain of at least one of an event or one or more objects within a visualization environment by identifying at least one evolution of the event or a dynamic property of the one or more objects; display, within the visualization environment, the at least one evolution of the event or the one or more objects having the dynamic property; and initiate one or more operations based on the at least one evolution of the event or the one or more objects.

For the foregoing embodiments, the method or functions may include any one of the following operations, alone or in combination with each other: Displaying comprises displaying, within the visualization environment, instances of the at least one of time, space, or gravity when the change of the property is in accordance with a user-defined criteria; Displaying comprises displaying, within the visualization environment, the one or more objects having the rate of change of the property in accordance with a user-defined criteria, and displaying, within the visualization environment, one or more instances of the at least one of time, space, or gravity for each of the one or more objects having the rate of change of the property in accordance with the user-defined criteria; Performing detection comprises identifying, within the visualization environment based on a user-defined criteria, the one or more objects having the dynamic property; Initiating the one or more operations comprises initiating maintenance of at least one of the one or more wells based on the production of the fluid associated with the one or more wells; Identifying the evolution of the event comprises detecting changes in pixel intensity for a set of images over at least one of selected spectral wavelengths or locations.

The higher dimensional domain comprises at least one of: spatial dimensions, one or more temporal dimensions, or a gravimetrical dimension associated with the at least one of event or one or more objects; The evolution of the event comprises a change of a property with at least one of time, space, or gravity; The property comprises at least one of: petrophysical property, rock physics property, chemical property, thermal property, hydrological property, mechanical property, or saturation of a fluid associated with a well of a hydrocarbon reservoir formation; The dynamic property comprises a rate of change of a property with at least one of time, space, or gravity; The dynamic property comprises a change of rate of a property with at least one of time, space, or gravity associated with the one or more objects, and the user-defined criteria is related to a common feature of the one or more objects; The dynamic property comprises a production of a fluid; The one or more objects comprise one or more wells producing the fluid; The set of images comprises multiple aerial photographs of a same location for different time instances; The set of images comprises multiple medical images of one or more human organs for different time instances; The images from the set vary over time, space, or one or more other dimensions.

Likewise, a system for high-dimensional detection has been described and include at least one processor and a memory coupled to the processor having instructions stored therein, which when executed by the processor, cause the processor to perform functions, including functions to: perform detection in a higher-dimensional domain of at least one of an event or one or more objects within a visualization environment by identifying at least one evolution of the event or a dynamic property of the one or more objects; display, within the visualization environment, the at least one evolution of the event or the one or more objects having the dynamic property; and initiate one or more operations based on the at least one evolution of the event or the one or more objects.

For any of the foregoing embodiments, the system may include any one of the following elements, alone or in combination with each other: the functions performed by the processor to display include functions to display, within the visualization environment, instances of the at least one of time, space, or gravity when the change of the property is in accordance with a user-defined criteria; the functions performed by the processor to display include functions to display, within the visualization environment, the one or more objects having the rate of change of the property with the at least one of time, space, or gravity in accordance with a user-defined criteria, and display, within the visualization environment, one or more instances of the at least one of time, space, or gravity for each of the one or more objects having the rate of change of the property in accordance with the user-defined criteria; the functions performed by the processor to perform detection include functions to identify, within the visualization environment based on a user-defined criteria, the one or more objects having the dynamic property; the functions performed by the processor to initiate the one or more operations include functions to initiate maintenance of at least one of the one or more wells based on the production of the fluid associated with the one or more wells; the functions performed by the processor to identify the evolution of the event include functions to detect changes in pixel intensity for a set of images over at least one of selected spectral wavelengths or locations.

Embodiments of the present disclosure support the usage of graphical user interface (visualization environment) that, unlike the prior art, consider higher order dimensions (i.e., spatial dimensions, gravity and/or multiple instances of time). The visualization environment presented herein solves the higher order dimensional attribute identification problem ubiquitously, by providing a user with ability to quantitatively investigate data attributes that are not simultaneously displayed (including the use of wildcards in conducting event/object detection) and locate any data object or data object event associated with a specified property value changed with time, space, and/or gravity.

By applying the visualization environment presented herein, customers may save significant work-time by automatically identifying data objects or changes in those data attributes with time, space, and/or gravity. It is expected that the work-time can be saved by approximately 40% when utilizing the graphical user interface presented herein. Embodiments of the present disclosure can be integrated with advanced data analytics tools to streamline the amount of data to be analyzed. The data inventory and visualization environment of the Landmark's DecisionSpace® Geosciences software application can directly benefit from embodiments of the present disclosure as they facilitate user navigation and reduce data loss when compared to visualization environments of the prior art. Thus, embodiments of the present disclosure promote the DecisionSpace® for its ease-of-use and augmented user experience. However, embodiments of the present disclosure are not limited to the DecisionSpace® environment and can be applied to other visualization and analytical environments. A novel approach presented herein for quantitative interpretation and analysis can be applied in various visualization environments, medical and governmental entities, such as taxation (e.g., property tax assessment), defense, evaluation of climate change, general surveillance, and the like.

Embodiments of the present disclosure provide a utility for identifying transient data attributes associated with objects in the visualization environment that cannot be discerned in the midst of a large collection of data (low level functionality), qualitative visualization analysis or through user intuition. Users of any simulation visualization software often experience difficulty in identifying contemporaneous spatial and temporal changes in attributes using crude visualization analysis techniques that lack sufficient quantitative abilities. Software practitioners often spend a tremendous amount of time performing circuitous analysis to eventually formulate the same conclusion that could be automatically derived from the execution of embodiments of the present disclosure.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

As used herein, a phrase referring to "at least one of" a list of items refers to any combination of those items, including single members. As an example, "at least one of: a, b, or c" is intended to cover: a, b, c, a-b, a-c, b-c, and a-b-c.

While specific details about the above embodiments have been described, the above hardware and software descriptions are intended merely as example embodiments and are not intended to limit the structure or implementation of the disclosed embodiments. For instance, although many other internal components of computer system 600 are not shown, those of ordinary skill in the art will appreciate that such components and their interconnection are well known.

In addition, certain aspects of the disclosed embodiments, as outlined above, may be embodied in software that is executed using one or more processing units/components. Program aspects of the technology may be thought of as "products" or "articles of manufacture" typically in the form of executable code and/or associated data that is carried on or embodied in a type of machine readable medium. Tangible non-transitory "storage" type media include any or all of the memory or other storage for the computers, processors or the like, or associated modules thereof, such as various semiconductor memories, tape drives, disk drives, optical or magnetic disks, and the like, which may provide storage at any time for the software programming.

Additionally, the flowchart and block diagrams in the figures illustrate the architecture, functionality, and operation of possible implementations of systems, methods and computer program products according to various embodiments of the present disclosure. It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The above specific example embodiments are not intended to limit the scope of the claims. The example embodiments may be modified by including, excluding, or combining one or more features or functions described in the disclosure.

What is claimed is:

1. A computer-implemented method for high-dimensional detection of fluids in a hydrocarbon subsurface reservoir, the method comprising:

displaying a visualization environment of the subsurface reservoir, on a screen of a computing device, containing an array of porosity objects including one or more subsurface reservoir objects on a three-dimensional (3D) grid, showing detection of a reduction in porosity for locations in the array of porosity objects or a change of a particular property;

receiving, from a user, a user-defined criteria comprising a rate of change of a property with at least one of time, space, or gravity that defines an evolution of a subsurface reservoir event or dynamic property of one or more subsurface reservoir objects desired to be identified within the visualization environment of the subsurface reservoir, wherein the dynamic property comprises at least a production of a fluid and the one or more subsurface reservoir objects comprise one or more wells producing the fluid;

based upon the received user-defined criteria, detecting, within a space, time or gravity dimensional domain of the visualization environment, at least one evolution of the subsurface reservoir event or a dynamic property of the one or more subsurface reservoir objects;

displaying, within the visualization environment of the subsurface reservoir, the at least one evolution of the subsurface reservoir event or the one or more subsurface reservoir objects having the dynamic property;

wherein the displaying comprises:

displaying, within the visualization environment of the subsurface reservoir, instances of the at least one of time, space, or gravity when the change of the property is in accordance with the user-defined criteria;

displaying, within the visualization environment of the subsurface reservoir, the one or more subsurface reservoir objects having the rate of change of the property in accordance with the user-defined criteria;

displaying, within the visualization environment of the subsurface reservoir, one or more instances of the at least one of time, space, or gravity for each of the one or more objects having the rate of change of the property in accordance with the user-defined criteria; and initiating one or more operations associated with the fluids in the hydrocarbon subsurface reservoir based on the at least one evolution of the subsurface reservoir event or the one or more subsurface reservoir objects having the dynamic property, wherein the evolution comprises a change of the dynamic property over time.

2. The method of claim 1, wherein:
the property comprises at least one of: petrophysical property, rock physics property, chemical property, thermal property, hydrological property, mechanical property, or saturation of a fluid associated with a well of a hydrocarbon reservoir formation.

3. The method of claim 1, wherein the user-defined criteria comprises a rate of change of a property with at least one of time, space, or gravity.

4. The method of claim 1, wherein performing detection comprises:
identifying, within the visualization environment of the subsurface reservoir based on a user-defined criteria, the one or more subsurface reservoir objects having the dynamic property.

5. The method of claim 4, wherein:
the dynamic property comprises a change of rate of a property with at least one of time, space, or gravity associated with the one or more objects, and the user-defined criteria is related to a common feature of the one or more subsurface reservoir objects.

6. The method of claim 1, wherein:
optionally initiating the one or more operations comprises initiating maintenance of at least one of the one or more wells based on the production of the fluid associated with the one or more wells.

7. The method of claim 1, wherein identifying the evolution of the subsurface reservoir event comprises:
detecting changes in pixel intensity for a set of images over at least one of selected spectral wavelengths or locations.

8. A system for high-dimensional detection of fluids in a hydrocarbon subsurface reservoir, the system comprising:
at least one processor; and
a memory coupled to the processor having instructions stored therein, which when executed by the processor, cause the processor to perform functions, including functions to:
displaying a visualization environment of the subsurface reservoir, on a screen of a computing device, containing an array of porosity objects including one or more subsurface reservoir objects on a three-dimensional (3D) grid, showing detection of a reduction in porosity for locations in the array of porosity objects or a change of a particular property;
receiving, from a user, a user-defined criteria that defines an evolution of a subsurface reservoir event or dynamic property of one or more subsurface reservoir objects desired to be identified within the visualization environment of the subsurface reservoir, wherein the dynamic property comprises at least a production of a fluid and the one or more subsurface reservoir objects comprise one or more wells producing the fluid;
based upon the received user-defined criteria, detecting, within a space, time or gravity dimensional domain of the visualization environment, at least one evolution of the subsurface reservoir event or a dynamic property of the one or more subsurface reservoir objects;
displaying, within the visualization environment of the subsurface reservoir, the at least one evolution of the subsurface reservoir event or the one or more subsurface reservoir objects having the dynamic property;
wherein the displaying comprises:
displaying, within the visualization environment of the subsurface reservoir, instances of the at least one of time, space, or gravity when the change of the property is in accordance with the user-defined criteria;
displaying, within the visualization environment of the subsurface reservoir, the one or more subsurface reservoir objects having the rate of change of the property in accordance with the user-defined criteria;
displaying, within the visualization environment of the subsurface reservoir, one or more instances of the at least one of time, space, or gravity for each of the one or more objects having the rate of change of the property in accordance with the user-defined criteria; and
initiating one or more operations associated with the fluids in the hydrocarbon subsurface reservoir based on the at least one evolution of the subsurface reservoir event or the one or more subsurface reservoir objects having the dynamic property, wherein the evolution comprises a change of the dynamic property over time.

9. The system of claim 8, wherein the functions performed by the processor to perform detection include functions to:
identify, within the visualization environment of the subsurface reservoir based on a user-defined criteria, the one or more subsurface reservoir objects having the dynamic property.

10. The system of claim 9, wherein:
the user-defined criteria is related to a common feature of the one or more subsurface reservoir objects.

11. The system of claim 8, wherein:
the functions performed by the processor to initiate the one or more operations include functions to initiate maintenance of at least one of the one or more wells based on the production of the fluid associated with the one or more wells.

12. The system of claim 8, wherein the functions performed by the processor to identify the evolution of the subsurface reservoir event include functions to:
detect changes in pixel intensity for a set of images over at least one of selected spectral wavelengths or locations.

13. A non-transitory computer-readable storage medium having instructions stored therein, which when executed by a computer cause the computer to perform a plurality of functions, including functions to:
displaying a visualization environment of the subsurface reservoir, on a screen of a computing device, containing an array of porosity objects including one or more subsurface reservoir objects on a three-dimensional (3D) grid, showing detection of a reduction in porosity for locations in the array of porosity objects or a change of a particular property;
receiving, from a user, a user-defined criteria comprising a rate of change of a property with at least one of time, space, or gravity that defines an evolution of a subsurface reservoir event or dynamic property of one or more subsurface reservoir objects desired to be identified within the visualization environment of the subsurface reservoir, wherein the dynamic property comprises at least a production of a fluid and the one or more subsurface reservoir objects comprise one or more wells producing the fluid;

based upon the received user-defined criteria, detecting, within a space, time or gravity dimensional domain of the visualization environment, at least one evolution of the subsurface reservoir event or a dynamic property of the one or more subsurface reservoir objects;

displaying, within the visualization environment of the subsurface reservoir, the at least one evolution of the subsurface reservoir event or the one or more subsurface reservoir objects having the dynamic property;

wherein the displaying comprises:

displaying, within the visualization environment of the subsurface reservoir, instances of the at least one of time, space, or gravity when the change of the property is in accordance with the user-defined criteria;

displaying, within the visualization environment of the subsurface reservoir, the one or more subsurface reservoir objects having the rate of change of the property in accordance with the user-defined criteria;

displaying, within the visualization environment of the subsurface reservoir, one or more instances of the at least one of time, space, or gravity for each of the one or more objects having the rate of change of the property in accordance with the user-defined criteria; and initiating one or more operations associated with the fluids in the hydrocarbon subsurface reservoir based on the at least one evolution of the subsurface reservoir event or the one or more subsurface reservoir objects having the dynamic property, wherein the evolution comprises a change of the dynamic property over time.

* * * * *